(12) United States Patent
Kang et al.

(10) Patent No.: US 10,941,033 B2
(45) Date of Patent: Mar. 9, 2021

(54) 3D STACK CONFIGURATION FOR 6-AXIS MOTION SENSOR

(71) Applicant: InvenSense, Inc., San Jose, CA (US)

(72) Inventors: Dongyang Kang, San Jose, CA (US); Bongsang Kim, Mountain View, CA (US); Bei Zhu, Los Gatos, CA (US); Ian Flader, Redwood City, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/540,907

(22) Filed: Aug. 14, 2019

(65) Prior Publication Data
US 2020/0131027 A1    Apr. 30, 2020

Related U.S. Application Data

(60) Provisional application No. 62/752,978, filed on Oct. 30, 2018.

(51) Int. Cl.
*B81B 7/00*    (2006.01)
*B81C 3/00*    (2006.01)
*B81C 1/00*    (2006.01)
*B81B 1/00*    (2006.01)

(52) U.S. Cl.
CPC ............. *B81B 7/007* (2013.01); *B81B 1/004* (2013.01); *B81B 7/0006* (2013.01); *B81C 1/00063* (2013.01); *B81C 1/00095* (2013.01); *B81C 1/00166* (2013.01); *B81C 1/00301* (2013.01); *B81C 3/001* (2013.01); *B81B 2201/0235* (2013.01); *B81B 2201/0242* (2013.01); *B81B 2203/033* (2013.01); *B81B 2203/04* (2013.01); *B81B 2207/096* (2013.01); *B81C 2203/036* (2013.01); *B81C 2203/038* (2013.01)

(58) Field of Classification Search
CPC combination set(s) only.
See application file for complete search history.

(56) References Cited

U.S. PATENT DOCUMENTS

2015/0375995 A1*  12/2015  Steimle ............... B81C 1/00246
                                                                257/418
2016/0060105 A1*  3/2016  Kolb .................. B81C 1/00182
                                                                257/417

* cited by examiner

*Primary Examiner* — Matthew L Reames

(57) ABSTRACT

A method includes fusion bonding a first side of a MEMS wafer to a second side of a first handle wafer. A TSV is formed from a first side of the first handle wafer to the second side of the first handle wafer and into the first MEMS wafer. A dielectric layer is formed on the first side of the first handle wafer. A tungsten via is formed in the dielectric layer. Electrodes are formed on the dielectric layer. A second MEMS wafer is eutecticly bonded with a first eutectic bond to the electrodes, wherein the TSV electrically connects the first MEMS wafer to the second MEMS wafer. Standoffs are formed on a second side of the first MEMS wafer. A CMOS wafer is eutecticly bonded with a second eutectic bond to the standoffs, wherein the second eutectic bond includes different materials than the first eutectic bond.

25 Claims, 19 Drawing Sheets

3500

```
┌─────────────────────────────────────────────────────────────┐
│ FIRST SIDE OF A MEMS DEVICE WAFER IS FUSION BONDED TO A     │
│ SECOND SIDE OF A FIRST HANDLE WAFER                         │
│ 3502                                                        │
└─────────────────────────────────────────────────────────────┘
                             │
┌─────────────────────────────────────────────────────────────┐
│ A TSV IS FORMED FROM A FIRST SIDE OF THE FIRST HANDLE WAFER │
│ TO THE SECOND SIDE OF THE FIRST HANDLE WAFER AND INTO THE   │
│ FIRST MEMS DEVICE WAFER                                     │
│ 3504                                                        │
└─────────────────────────────────────────────────────────────┘
                             │
┌─────────────────────────────────────────────────────────────┐
│ A DIELECTRIC LAYER IS FORMED ON THE FIRST SIDE OF THE FIRST │
│ HANDLE WAFER                                                │
│ 3506                                                        │
└─────────────────────────────────────────────────────────────┘
                             │
┌─────────────────────────────────────────────────────────────┐
│ A TUNGSTEN VIA IS FORMED IN THE DIELECTRIC LAYER            │
│ 3508                                                        │
└─────────────────────────────────────────────────────────────┘
                             │
┌─────────────────────────────────────────────────────────────┐
│ ELECTRODES ARE FORMED ON THE DIELECTRIC LAYER               │
│ 3510                                                        │
└─────────────────────────────────────────────────────────────┘
                             │
┌─────────────────────────────────────────────────────────────┐
│ A SECOND MEMS DEVICE WAFER IS EUTECTICLY BONDED WITH A      │
│ FIRST EUTECTIC BOND TO THE ELECTRODES, WHEREIN THE TSV      │
│ ELECTRICALLY CONNECTS THE FIRST MEMS DEVICE WAFER TO THE    │
│ SECOND MEMS DEVICE WAFER                                    │
│ 3512                                                        │
└─────────────────────────────────────────────────────────────┘
                             │
┌─────────────────────────────────────────────────────────────┐
│ STANDOFFS ARE FORMED ON A SECOND SIDE OF THE FIRST MEMS     │
│ DEVICE WAFER                                                │
│ 3514                                                        │
└─────────────────────────────────────────────────────────────┘
                             │
┌─────────────────────────────────────────────────────────────┐
│ A CMOS WAFER IS EUTECTICLY BONDED WITH A SECOND EUTECTIC    │
│ BOND TO THE STANDOFFS, WHEREIN THE SECOND EUTECTIC BOND     │
│ INCLUDES DIFFERENT MATERIALS THAN THE FIRST EUTECTIC BOND   │
│ 3516                                                        │
└─────────────────────────────────────────────────────────────┘
```

```
┌─────────────────────────────────────────────────────────────┐
│ A FIRST SIDE OF A MEMS DEVICE WAFER IS FUSION BONDED TO A   │
│         SECOND SIDE OF A FIRST HANDLE WAFER                 │
│                          3602                                │
└─────────────────────────────────────────────────────────────┘
```

- 3602: A FIRST SIDE OF A MEMS DEVICE WAFER IS FUSION BONDED TO A SECOND SIDE OF A FIRST HANDLE WAFER

- 3604: A DIELECTRIC LAYER IS FORMED ON A FIRST SIDE OF THE FIRST HANDLE WAFER

- 3606: A TUNGSTEN VIA IS FORMED IN THE DIELECTRIC LAYER

- 3608: ELECTRODES ARE FORMED ON THE DIELECTRIC LAYER, WHEREIN THE ELECTRODES INCLUDE A FIRST ELECTRODE AND A SECOND ELECTRODE

- 3610: A SECOND MEMS DEVICE WAFER IS EUTECTICLY BONDED WITH A FIRST EUTECTIC BOND TO THE FIRST ELECTRODE

- 3612: STANDOFFS ARE FORMED ON A SECOND SIDE OF THE FIRST MEMS DEVICE WAFER

- 3614: A CMOS WAFER IS EUTECTICLY BONDED WITH A SECOND EUTECTIC BOND TO THE STANDOFFS, WHEREIN THE SECOND EUTECTIC BOND INCLUDES DIFFERENT MATERIALS THAN THE FIRST EUTECTIC BOND

- 3616: THE SECOND ELECTRODE IS EUTECTICLY CONNECTED TO THE CMOS WAFER WITH A BOND WIRE

FIG. 36

3D STACK CONFIGURATION FOR 6-AXIS MOTION SENSOR

CROSS-REFERENCE TO RELATED APPLICATIONS

This application claims the benefit of U.S. Provisional Patent Application Ser. No. 62/752,978 filed Oct. 30, 2018, entitled "3D STACK CONFIGURATION FOR 6-AXIS MOTION SENSOR."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is a method including fusion bonding a first side of a MEMS device wafer to a second side of a first handle wafer. A through silicon via ("TSV") is formed from a first side of the first handle wafer to the second side of the first handle wafer and into the first MEMS device wafer. A dielectric layer is formed on the first side of the first handle wafer. A tungsten via is formed in the dielectric layer. Electrodes are formed on the dielectric layer. A second MEMS device wafer is eutecticly bonded with a first eutectic bond to the electrodes, wherein the TSV electrically connects the first MEMS device wafer to the second MEMS device wafer. Standoffs are formed on a second side of the first MEMS device wafer. A CMOS ("complementary metal-oxide semiconductor") wafer is eutecticly bonded with a second eutectic bond to the standoffs, wherein the second eutectic bond includes different materials than the first eutectic bond.

BRIEF DESCRIPTION OF DRAWINGS

FIG. 35 shows an exemplary flow diagram for forming a 3D stack configuration according to one aspect of the present embodiments.

FIG. 36 shows an exemplary flow diagram for forming a 3D stack configuration according to one aspect of the present embodiments.

DESCRIPTION

Figure 1:
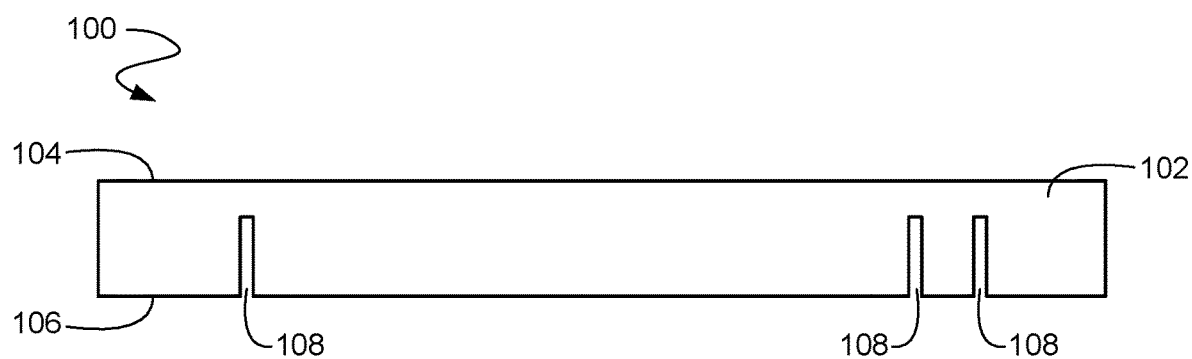
FIG. 1 shows a 3D stack configuration for MEMS sensors at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS sensor includes mechanical elements and may optionally include electronics (e.g. electronics for sensing). MEMS sensors include but are not limited to, for example, gyroscopes, accelerometers, magnetometers, microphones, pressure sensors, etc. As technology advances, it is desirable to reduce the size of consumer electronic devices that include the MEMS sensors.

Some methods reduce the size of the proof mass in order to reduce the sensor size. In addition, power consumption is reduced by improving circuit design. Furthermore, the MEMS sensors are separately fabricated, but that leads to an increase in die size.

According to embodiments described herein, stacking two different MEMS sensors reduces the sensor area and power consumption, allowing further reduction in consumer electronic devices. Moreover, reducing the area reduces the cost, power consumption, etc. Furthermore, MEMS sensors (e.g. accelerometer and gyroscope) could be fabricated separately to enable the use of best processes for each MEMS sensor.

In various embodiments, a wafer consisting of a motion sensor, such as an accelerometer, is formed and vertically stacked over another motion sensor wafer, such as a gyroscope, and then bonded to a CMOS wafer, forming an integrated motion sensor die configuration. In some embodiments, a 3-axis accelerometer is fabricated over a 3-axis gyroscope and then bonded to a CMOS wafer. In other embodiments, a 3-axis gyroscope is fabricated over a 3-axis accelerometer and then bonded to a CMOS wafer. The CMOS wafer processes signals from both the accelerometer and the gyroscope. In addition, a TSV is used to connect a top sensor to a bottom CMOS. Furthermore, a trench oxide isolation method is used to connect the top MEMS sensor to the bottom CMOS.

Accordingly, the die area can be reduced (e.g. by 50%), the cost can be reduced, and the power consumption is reduced. In addition, accelerometers and gyroscopes can be fabricated separately to enable the use of best process for each, and the thermal gradient issue is addressed by increasing the accelerometer cavity pressure. In various embodiments, the HDP ("High Density Plasma") module is removed, thereby saving one mask. Removing the HDP module also improves accelerometer and gyroscope charging, and the HDP dummy area is removed, which further reduces the die size. Furthermore, the SAM ("Self-Assembled Monolayer") is removed from gyroscopes, which improves charging issues with gyroscopes, and stable electrode for accelerometers and Ti getter electrode for gyroscopes are used.

Referring now to FIG. 1, a 3D stack configuration 100 for MEMS sensors at an early stage of manufacture is shown according to one aspect of the present embodiments. A first handle wafer 102 is provided. The first handle wafer 102 includes a first side 104 and a second side 106. In various embodiments, the first handle wafer 102 is highly doped silicon that includes a dopant density greater than or equal to ("≥") $10^{17}$ atoms per $cm^3$. As such, the highly doped silicon of the first handle wafer 102 is electrically conductive. In various embodiments, the silicon is doped with poly anneal or poly drive-in to form the highly doped silicon. A number of trenches 108 are etched into the second side 106 of the first handle wafer 102.

Figure 2:
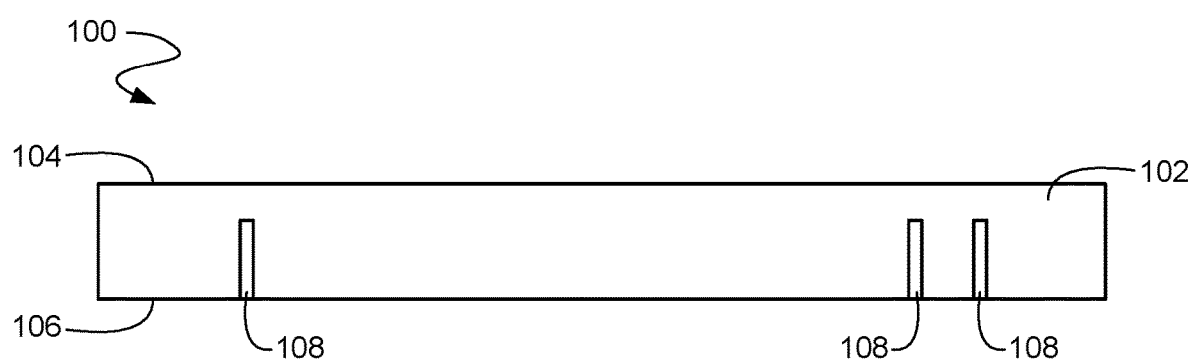
FIG. 2 shows the 3D stack configuration after trench fill according to one aspect of the present embodiments.

Referring now to FIG. 2, the 3D stack configuration 100 after trench fill is shown according to one aspect of the present embodiments. The trenches 108 have been filled with an oxide, thereby forming a trench oxide fill in the first handle wafer 102. After further processing described below, the trench filled oxide will electrically isolate components within the electrically conductive first handle wafer 102.

Figure 3:
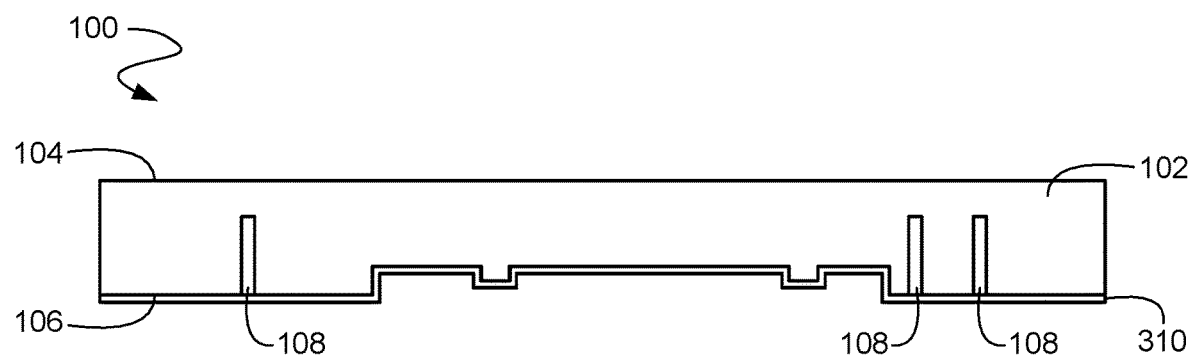
FIG. 3 shows the 3D stack configuration after fusion bond oxide deposition according to one aspect of the present embodiments.

Referring now to FIG. 3, the 3D stack configuration 100 after fusion bond oxide deposition is shown according to one aspect of the present embodiments. A fusion bond oxide 310 is deposited on the second side 106 of the first handle wafer 102. The fusion bond oxide 310 covers the second side 106 of the first handle wafer 102, including the oxide filled trenches 108.

Figure 4:
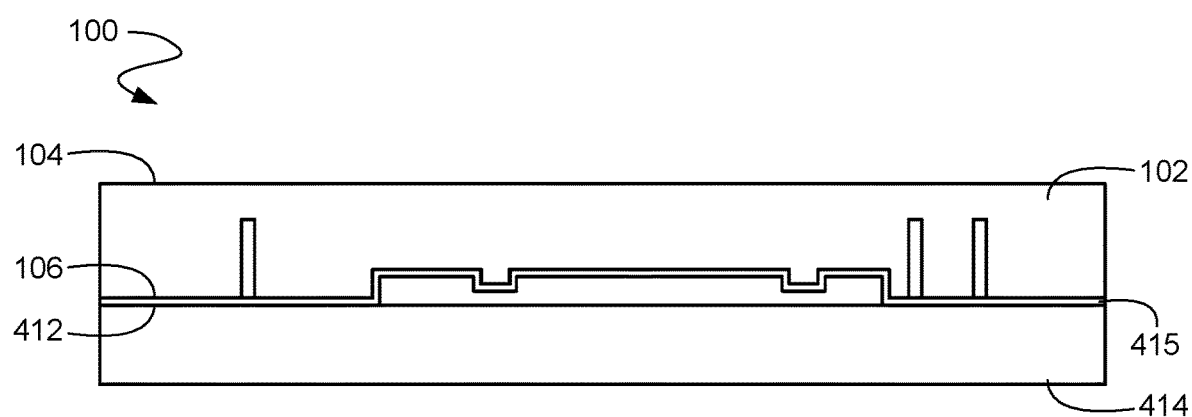
FIG. 4 shows the 3D stack configuration after fusion bonding according to one aspect of the present embodiments.

Referring now to FIG. 4, the 3D stack configuration 100 after fusion bonding is shown according to one aspect of the present embodiments. The second side 106 of the first handle wafer 102 is fusion bonded to a first side 412 of a first MEMS device wafer 414. The fusion bond oxide 310 (FIG. 3) forms a fusion bond 415, connecting the first handle wafer 102 to the first MEMS device wafer 414.

Figure 5:
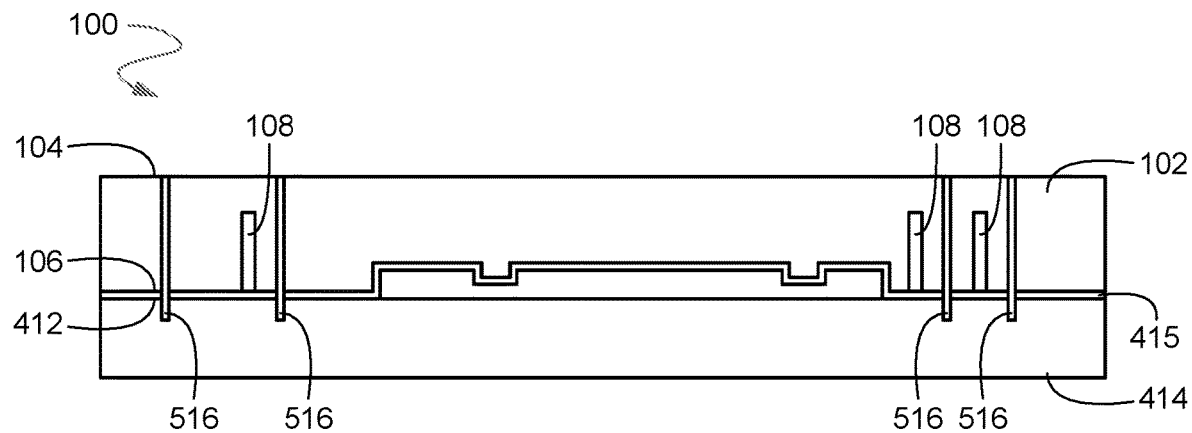
FIG. 5 shows the 3D stack configuration after formation of TSVs according to one aspect of the present embodiments.

Referring now to FIG. 5, the 3D stack configuration 100 after formation of TSVs is shown according to one aspect of the present embodiments. TSVs 516 are formed from the first side 104 of the first handle wafer 102 to the second side 106 of the first handle wafer 102 and into the first MEMS device wafer 414. In various embodiments, the TSVs 516 are filled with polysilicon, and some embodiments include in-situ doping of the polysilicon in the TSVs 516.

Figure 6:
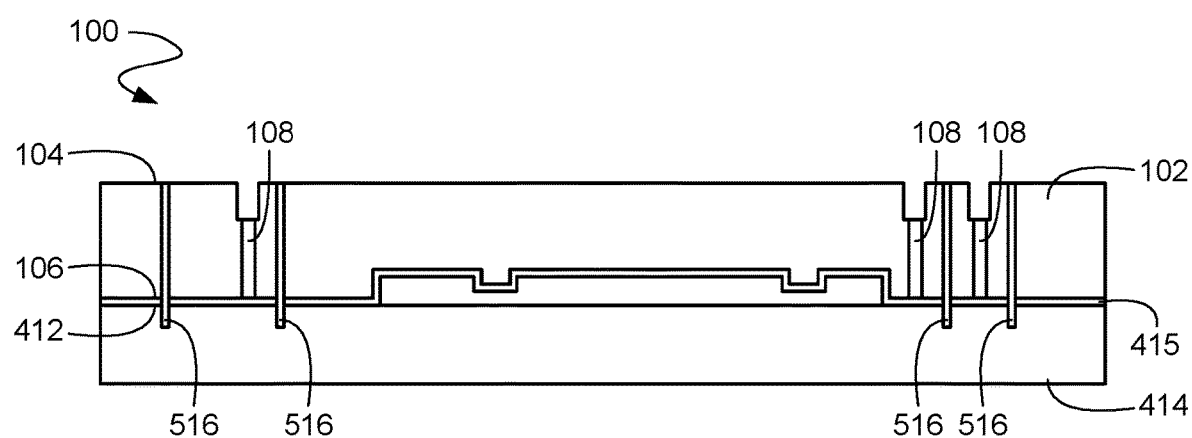
FIG. 6 shows the 3D stack configuration after further trench etch of the first handle wafer according to one aspect of the present embodiments.

Referring now to FIG. 6, the 3D stack configuration 100 after further trench etch of the first handle wafer 102 is shown according to one aspect of the present embodiments. The first side 104 of the first handle wafer 102 is etched to form vias that reach the oxide filled trenches 108. As such, after the etching, the trenches 108 extend from the first side 104 of the handle wafer 102 to the second side 106 of the first handle wafer 102.

Figure 7:
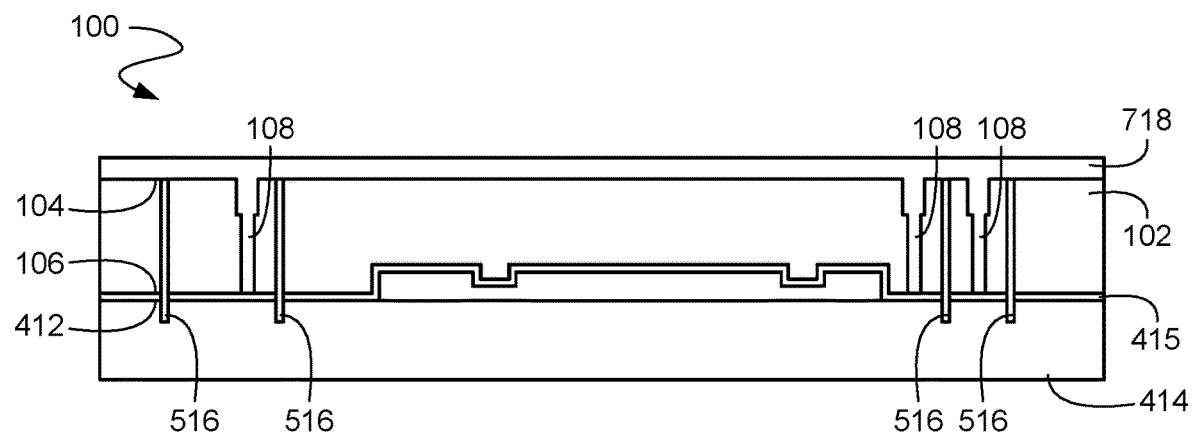
FIG. 7 shows the 3D stack configuration after oxide fill according to one aspect of the present embodiments.

Referring now to FIG. 7, the 3D stack configuration 100 after oxide fill is shown according to one aspect of the present embodiments. Oxide is deposited on the first side 104 of the first handle wafer 102. The oxide covers the first side 104 and fills the trenches 108. As such, after the oxide fill, the oxide filled trenches 108 extend from the first side 104 of the handle wafer 102 to the second side 106 of the first handle wafer 102. In addition, the oxide forms a dielectric layer 718 on the first side 104 of the first handle wafer 102. Furthermore, after the oxide fill, the oxide filled trenches 108 electrically isolate the TSVs 516 in the first handle wafer 102, as discussed above in FIG. 2.

Figure 8:
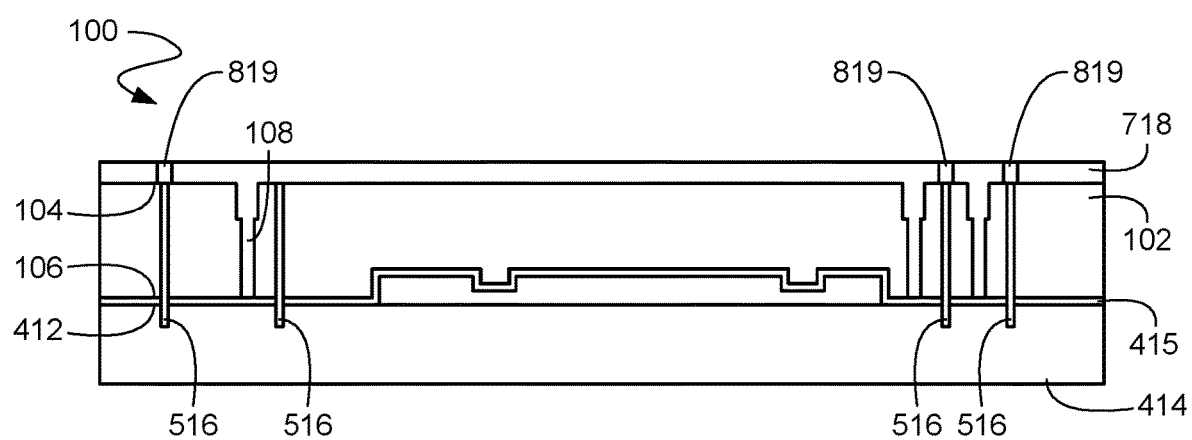
FIG. 8 shows the 3D stack configuration after tungsten via formation according to one aspect of the present embodiments.

Referring now to FIG. 8, the 3D stack configuration 100 after tungsten via formation is shown according to one aspect of the present embodiments. Tungsten vias 819 are formed in the dielectric layer 718. In various embodiments, the tungsten vias 819 are in overlying contact with the TSVs 516. The tungsten vias 819 provide electrical connections through the non-conductive dielectric layer 718.

Figure 9:
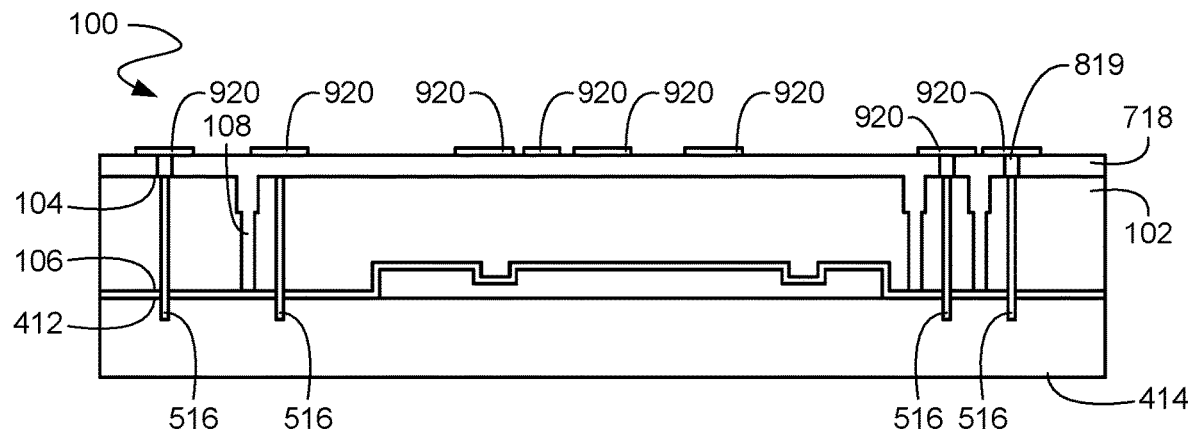
FIG. 9 shows the 3D stack configuration after electrode deposition and patterning according to one aspect of the present embodiments.

Referring now to FIG. 9, the 3D stack configuration 100 after electrode deposition and patterning is shown according to one aspect of the present embodiments. Electrode deposition and patterning forms one or more electrodes 920 (e.g. first electrode, second electrode, etc.) on the dielectric layer 718. The electrodes 920 may include, for example, bond, sense, and/or shield electrodes. It is understood that the preceding list of electrodes is non-limiting, and some embodiments may include other electrodes for any purpose. In various embodiments, the electrodes 920 may include the same material or different materials (e.g. bond electrodes may include different materials than sense electrodes). Some non-limiting examples of materials used in the electrodes 920 include Al, poly Si, Ti/TiN, etc. Some of the electrodes 920 are electrically connected to the first MEMS device wafer 414 through the tungsten vias 819 and the TSVs 516.

Figure 10:
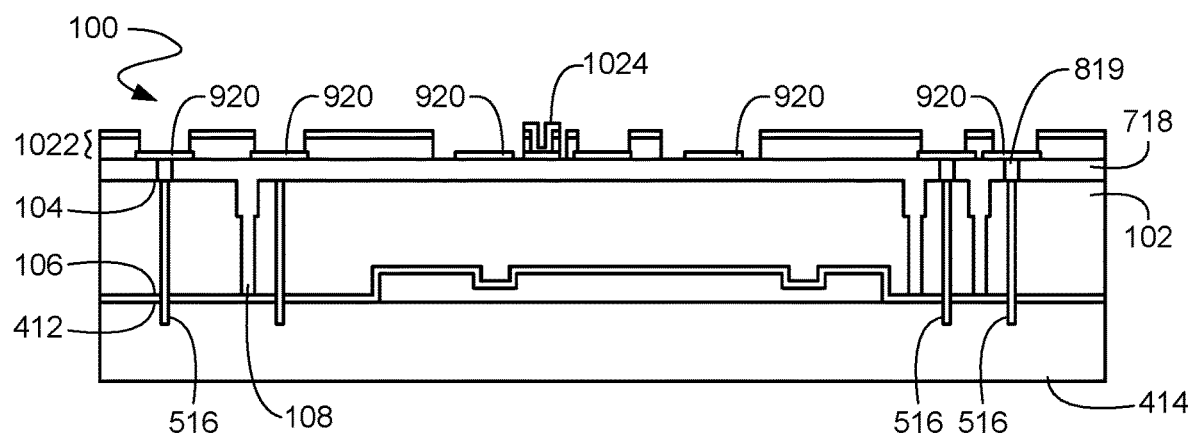
FIG. 10 shows the 3D stack configuration after passivation stack deposition and patterning according to one aspect of the present embodiments.

Referring now to FIG. 10, the 3D stack configuration 100 after passivation stack deposition and patterning is shown according to one aspect of the present embodiments. A passivation stack 1022 is deposited over the electrodes 920 and the dielectric layer 718. The passivation stack 1022 is patterned, exposing the electrodes 920. In some embodiments, the patterning of the passivation stack 1022 may form various components (e.g. bumpstop 1024, etc.).

Figure 11:
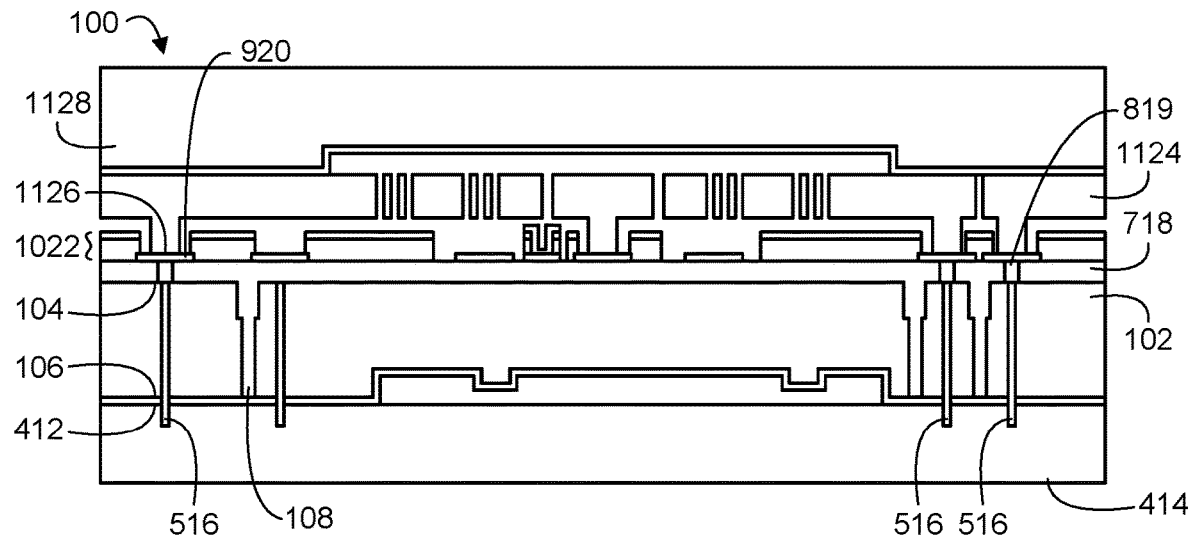
FIG. 11 shows the 3D stack configuration after eutectic bonding of another MEMS device wafer according to one aspect of the present embodiments.

Referring now to FIG. 11, the 3D stack configuration 100 after eutectic bonding of another MEMS device wafer is shown according to one aspect of the present embodiments. A second MEMS device wafer 1124 is eutecticly bonded with one or more first eutectic bonds 1126 to one or more of the electrodes 920 (e.g. bond electrodes). In some embodiments, the first eutectic bonds 1126 include Al and Si. After the eutectic bonding, the TSVs 516 and tungsten vias 819 electrically connect the first MEMS device wafer 414 to the second MEMS device wafer 1124.

A second handle wafer 1128 is fusion bonded to the second MEMS device wafer 1124. In various embodiments, the second MEMS device wafer 1124 includes any MEMS device. For example, the second MEMS device wafer 1124 may include a gyroscope or an accelerometer.

Figure 12:
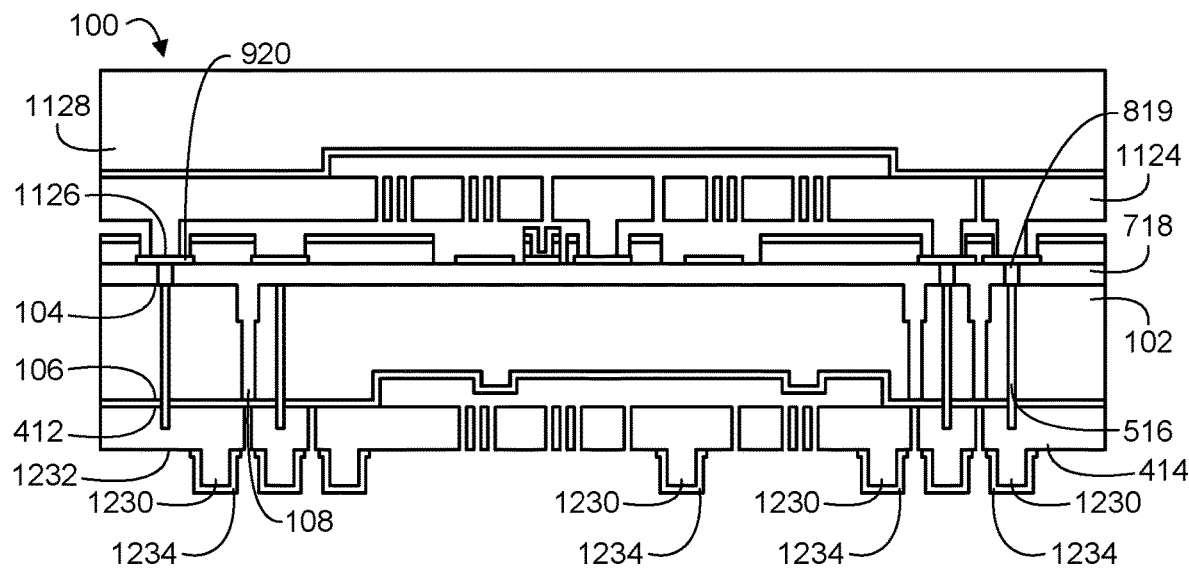
FIG. 12 shows the 3D stack configuration after standoff formation and actuator etch according to one aspect of the present embodiments.

Referring now to FIG. 12, the 3D stack configuration 100 after standoff formation and actuator etch is shown according to one aspect of the present embodiments. Standoffs 1230 are formed on a second side 1232 of the first MEMS device wafer 414. A eutectic bond metal 1234 (e.g. germanium) is deposited on the standoffs 1230. An actuator etch forms another MEMS device in the first MEMS device wafer 414. The first MEMS device wafer 414 includes any MEMS device. For example, the first MEMS device wafer 414 may include a gyroscope or an accelerometer.

Figure 13:
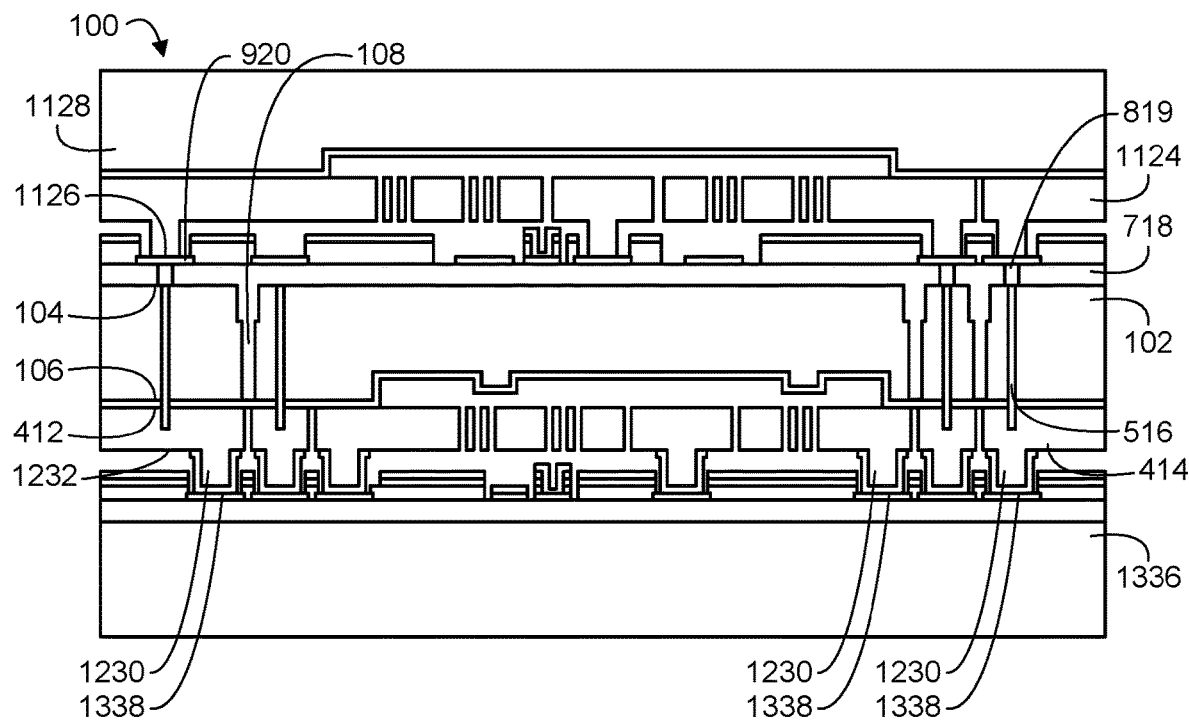
FIG. 13 shows the 3D stack configuration after eutectic bonding with a CMOS wafer according to one aspect of the present embodiments.

Referring now to FIG. 13, the 3D stack configuration 100 after eutectic bonding with a CMOS wafer is shown according to one aspect of the present embodiments. A CMOS wafer 1336 is eutecticly bonded to the first MEMS device wafer 414. One or more second eutectic bonds 1338 eutecticly bond one or more of the standoffs 1230 to the CMOS wafer 1236. In various embodiments, the second eutectic bonds 1338 include different materials than the first eutectic bonds 1126. For example, the second eutectic bond may include Al and Ge. As such, in some embodiments, the first eutectic bonds 1126 may have a higher melting point than the second eutectic bonds 1338.

Figure 14:
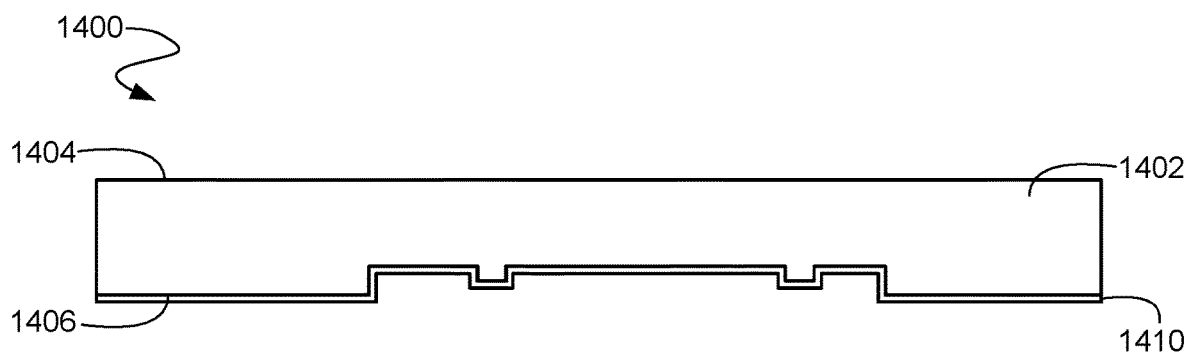
FIG. 14 shows another 3D stack configuration for MEMS sensors according to one aspect of the present embodiments.

Referring now to FIG. 14, another 3D stack configuration 1400 for MEMS sensors at an early stage of manufacture is shown according to one aspect of the present embodiments. A first handle wafer 1402 is provided. The first handle wafer 1402 includes a first side 1404 and a second side 1406. In various embodiments, the first handle wafer 1402 is lightly doped silicon. As such, the lightly doped silicon of the first handle wafer 1402 is not electrically conductive. A fusion bond oxide 1410 is deposited on the second side 1406 of the first handle wafer 1402 and covers the second side 1406 of the first handle wafer 1402.

Figure 15:
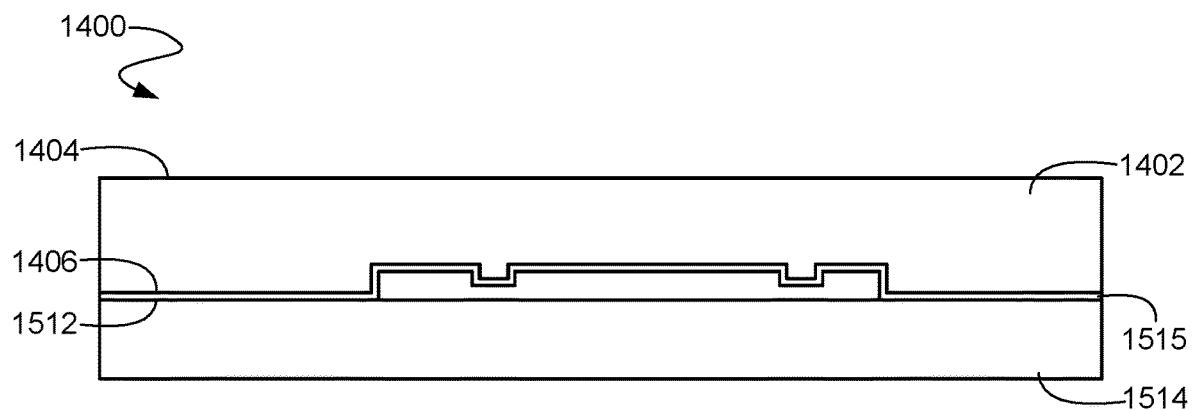
FIG. 15 shows the 3D stack configuration after fusion bonding according to one aspect of the present embodiments.

Referring now to FIG. 15, the 3D stack configuration 1400 after fusion bonding is shown according to one aspect of the present embodiments. The second side 1406 of the first handle wafer 1402 is fusion bonded to a first side 1512 of a first MEMS device wafer 1514. The fusion bond oxide 1410 (FIG. 14) forms a fusion bond 1515, connecting the first handle wafer 1402 to the first MEMS device wafer 1514.

Figure 16:
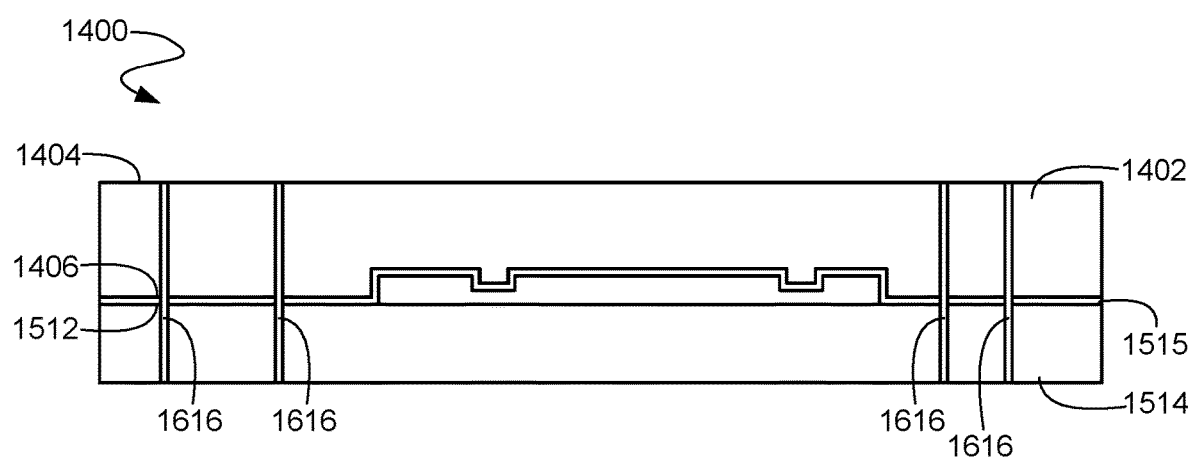
FIG. 16 shows the 3D stack configuration after formation of TSVs according to one aspect of the present embodiments.

Referring now to FIG. 16, the 3D stack configuration 1400 after formation of TSVs is shown according to one aspect of the present embodiments. TSVs 1616 are formed from the first side 1404 of the first handle wafer 1402 to the second side 1406 of the first handle wafer 1402 and into the first MEMS device wafer 1514. In various embodiments, the TSVs 1616 are filled with polysilicon, and some embodiments include in-situ doping of the polysilicon in the TSVs 1616.

Figure 17:
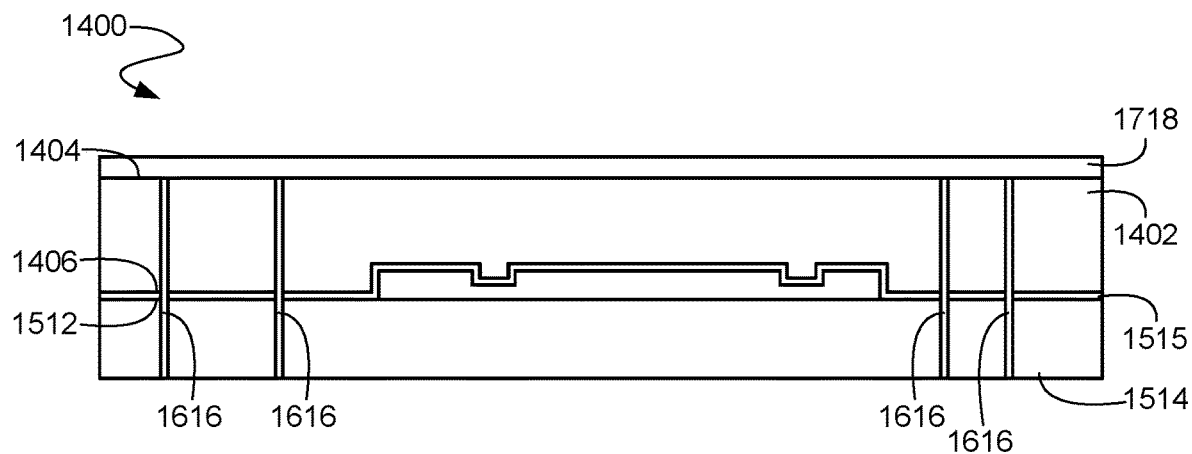
FIG. 17 shows the 3D stack configuration after oxide deposition according to one aspect of the present embodiments.

Referring now to FIG. 17, the 3D stack configuration 1400 after oxide deposition is shown according to one aspect of the present embodiments. Oxide is deposited on the first side 1404 of the first handle wafer 1402, covering the first side 1404. As such, the oxide forms a dielectric layer 1718 on the first side 1404 of the first handle wafer 1402.

Figure 18:
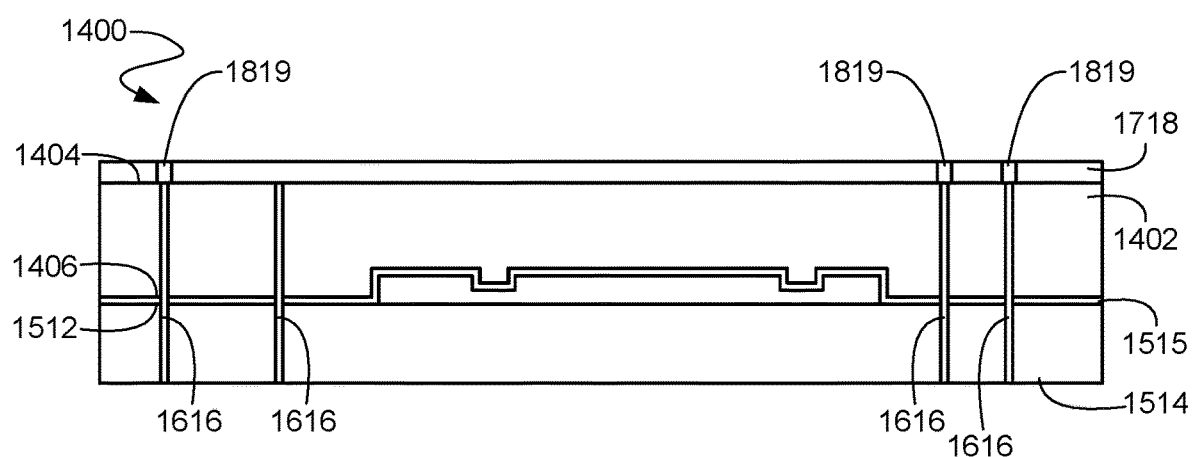
FIG. 18 shows the 3D stack configuration after tungsten via formation according to one aspect of the present embodiments.

Referring now to FIG. 18, the 3D stack configuration 1400 after tungsten via formation is shown according to one aspect of the present embodiments. Tungsten vias 1819 are formed in the dielectric layer 1718. In various embodiments, the tungsten vias 1819 are in overlying contact with the TSVs 1616. The tungsten vias 1819 provide electrical connections through the non-conductive dielectric layer 1718.

Figure 19:
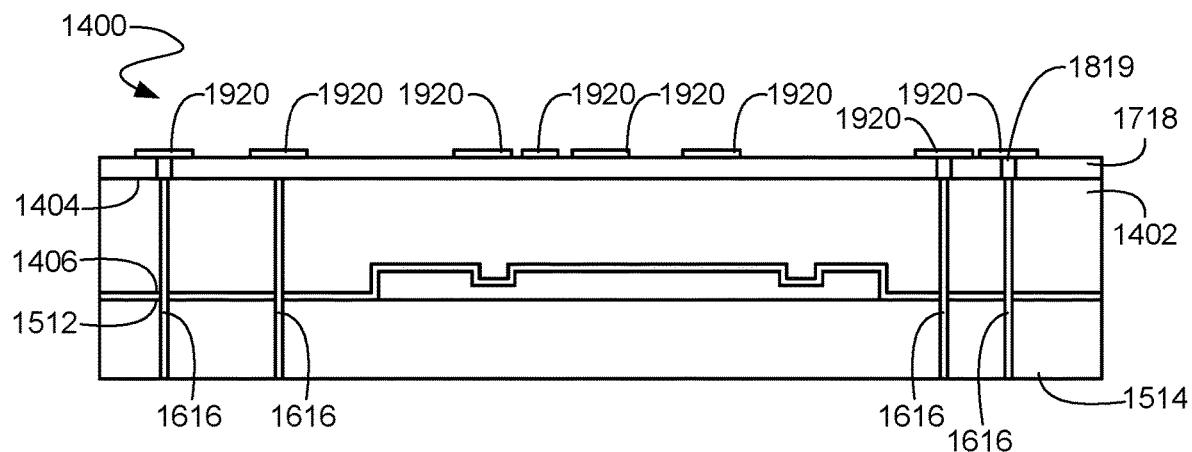
FIG. 19 shows the 3D stack configuration after electrode deposition and patterning according to one aspect of the present embodiments.

Referring now to FIG. 19, the 3D stack configuration 1400 after electrode deposition and patterning is shown according to one aspect of the present embodiments. Electrode deposition and patterning forms one or more electrodes 1920 (e.g. first electrode, second electrode, etc.) on the dielectric layer 1718. The electrodes 1920 may include, for example, bond, sense, and/or shield electrodes. It is understood that the preceding list of electrodes is non-limiting, and some embodiments may include other electrodes for any purpose. In various embodiments, the electrodes 1920 may include the same material or different materials (e.g. bond electrodes may include different materials than sense electrodes). Some non-limiting examples of materials used in the electrodes 1920 include Al, poly Si, Ti/TiN, etc. Some of the electrodes 1920 are electrically connected to the first MEMS device wafer 1514 through the tungsten vias 1819 and the TSVs 1616.

Figure 20:
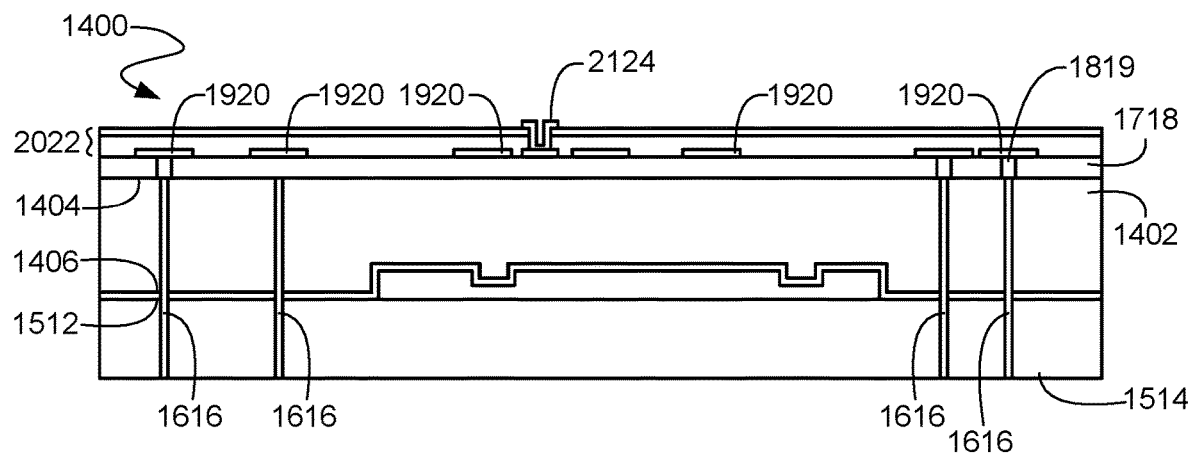
FIGS. 20 and 21 show the 3D stack configuration after passivation stack deposition and patterning according to one aspect of the present embodiments.
Figure 21:
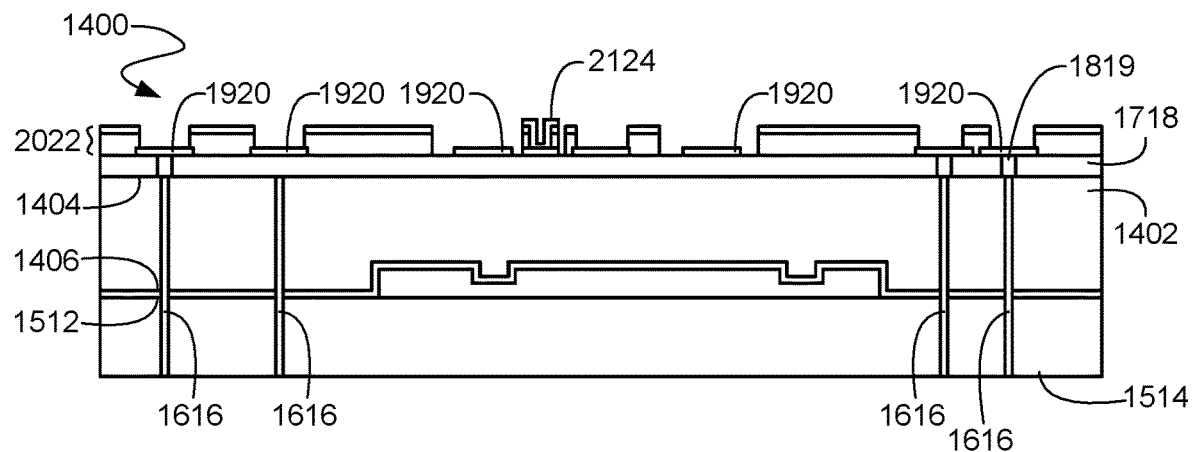

Referring now to FIGS. 20 and 21, the 3D stack configuration 1400 after passivation stack deposition and patterning is shown according to one aspect of the present embodiments. A passivation stack 2022 is deposited over the electrodes 1920 and the dielectric layer 1718. The passivation stack 2022 is patterned, exposing the electrodes 1920. In some embodiments, the patterning of the passivation stack 2022 may form various components (e.g. bumpstop 2124, etc.).

Figure 22:
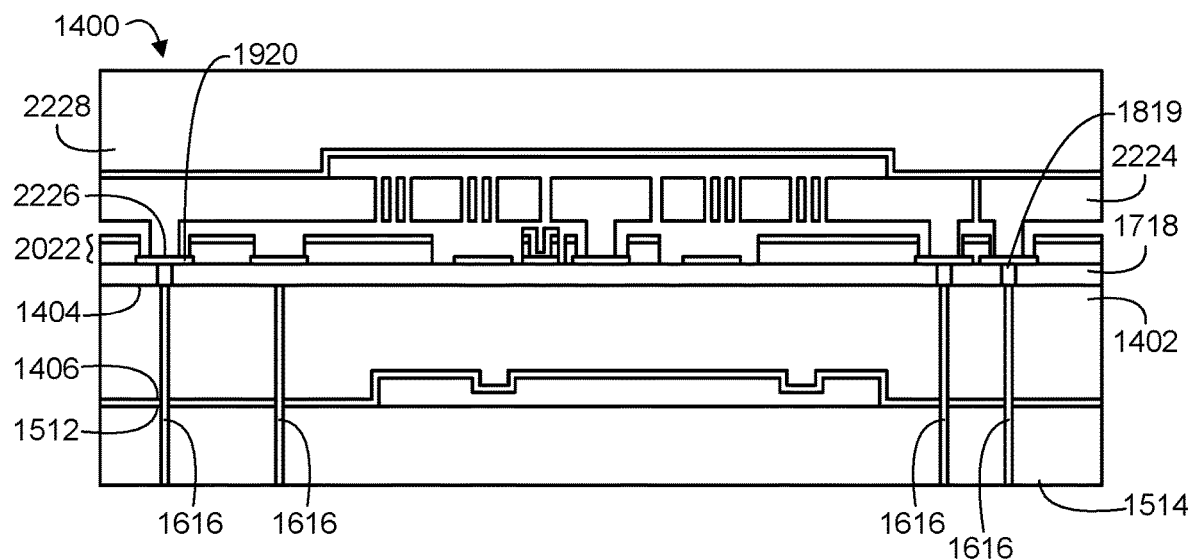
FIG. 22 shows the 3D stack configuration after eutectic bonding of another MEMS device wafer according to one aspect of the present embodiments.

Referring now to FIG. 22, the 3D stack configuration 1400 after eutectic bonding of another MEMS device wafer is shown according to one aspect of the present embodiments. A second MEMS device wafer 2224 is eutecticly bonded with one or more first eutectic bonds 2226 to one or more of the electrodes 1920 (e.g. bond electrodes). In some embodiments, the first eutectic bonds 2226 include Al and Si. After the eutectic bonding, the TSVs 1616 and tungsten vias 1819 electrically connect the first MEMS device wafer 1514 to the second MEMS device wafer 2224.

A second handle wafer 2228 is fusion bonded to the second MEMS device wafer 2224. In various embodiments, the second MEMS device wafer 2224 includes any MEMS device. For example, the second MEMS device wafer 2224 may include a gyroscope or an accelerometer.

Figure 23:
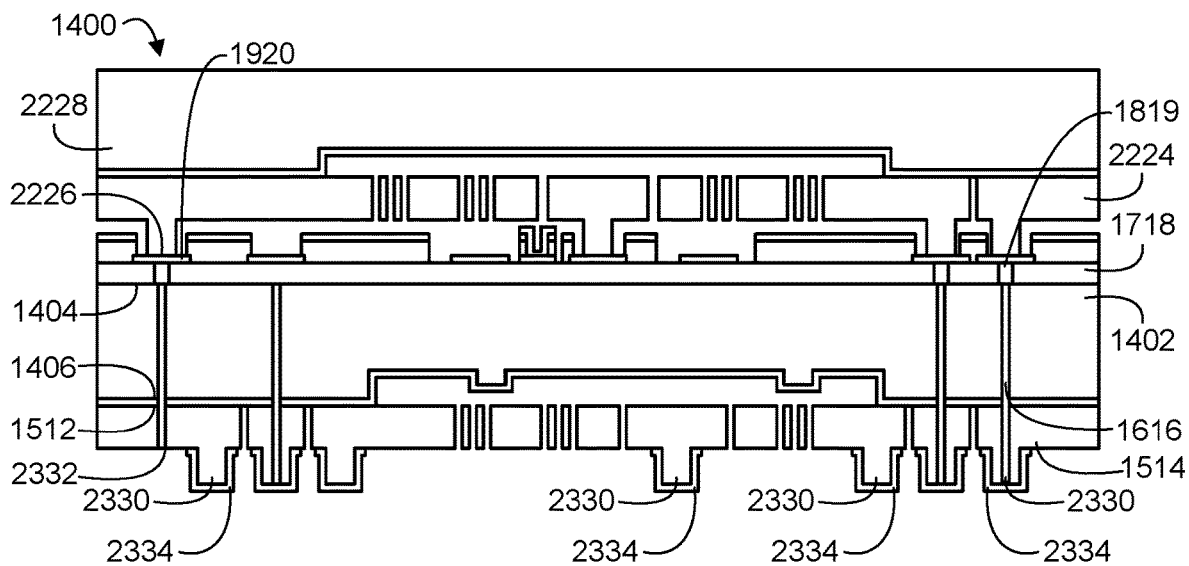
FIG. 23 shows the 3D stack configuration after standoff formation and actuator etch according to one aspect of the present embodiments.

Referring now to FIG. 23, the 3D stack configuration 1400 after standoff formation and actuator etch is shown according to one aspect of the present embodiments. Standoffs 2330 are formed on a second side 2332 of the first MEMS device wafer 1514. A eutectic bond metal 2334 (e.g. germanium) is deposited on the standoffs 2330. An actuator etch forms another MEMS device in the first MEMS device wafer 1514. The first MEMS device wafer 1514 includes any MEMS device. For example, the first MEMS device wafer 1514 may include a gyroscope or an accelerometer.

Figure 24:
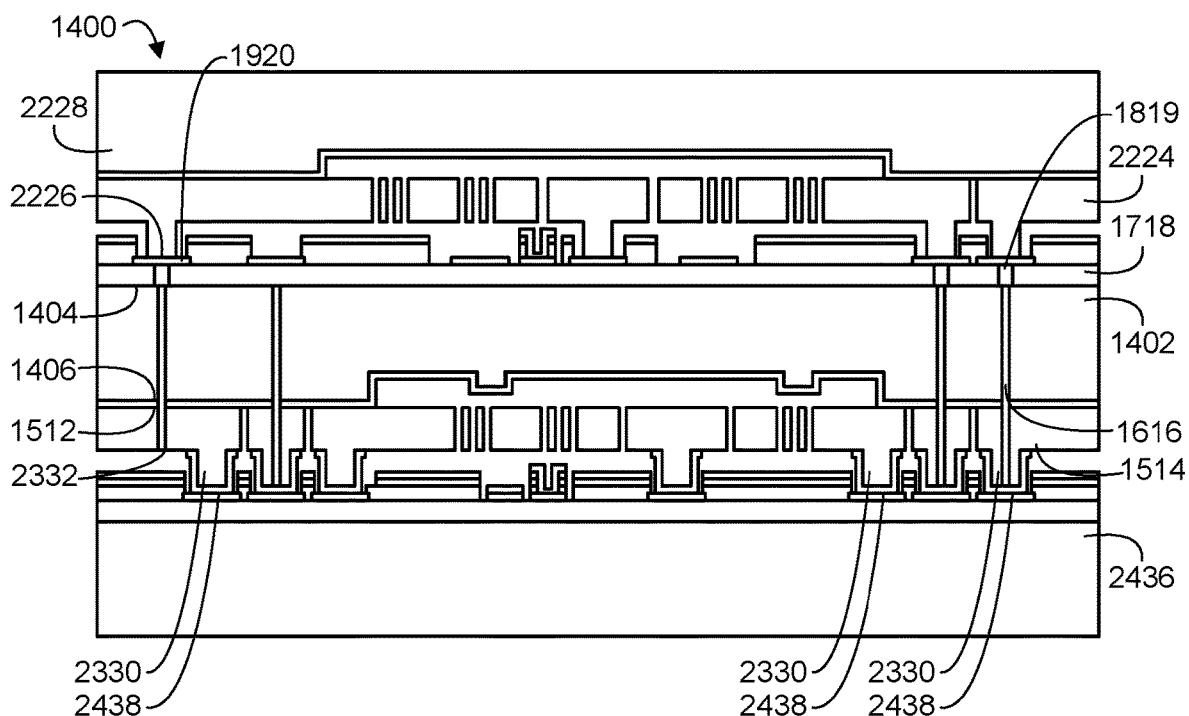
FIG. 24 shows the 3D stack configuration after eutectic bonding with a CMOS wafer according to one aspect of the present embodiments.

Referring now to FIG. 24, the 3D stack configuration 1400 after eutectic bonding with a CMOS wafer is shown according to one aspect of the present embodiments. A CMOS wafer 2436 is eutecticly bonded to the first MEMS device wafer 1514. One or more second eutectic bonds 2438 eutecticly bond one or more of the standoffs 2330 to the CMOS wafer 2436. In various embodiments, the second eutectic bonds 2438 include different materials than the first eutectic bonds 2226. For example, the second eutectic bond may include Al and Ge. As such, in some embodiments, the first eutectic bonds 2226 may have a higher melting point than the second eutectic bonds 2438.

Figure 25:
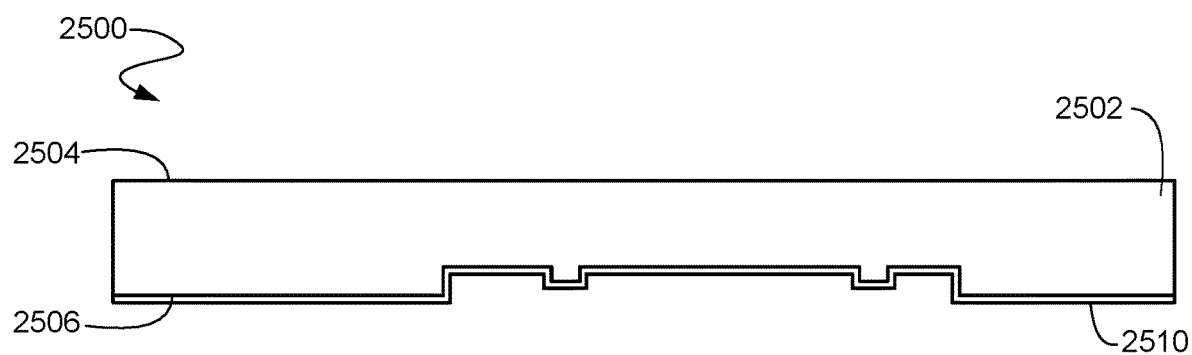
FIG. 25 shows another 3D stack configuration for MEMS sensors at an early stage of manufacture according to one aspect of the present embodiments.

Referring now to FIG. 25, another 3D stack configuration 2500 for MEMS sensors at an early stage of manufacture is shown according to one aspect of the present embodiments. A first handle wafer 2502 is provided. The first handle wafer 2502 includes a first side 2504 and a second side 2506. In various embodiments, the first handle wafer 2502 is lightly doped silicon. As such, the lightly doped silicon of the first handle wafer 2502 is not electrically conductive. A fusion bond oxide 2510 is deposited on the second side 2506 of the first handle wafer 2502 and covers the second side 2506 of the first handle wafer 2502.

Figure 26:
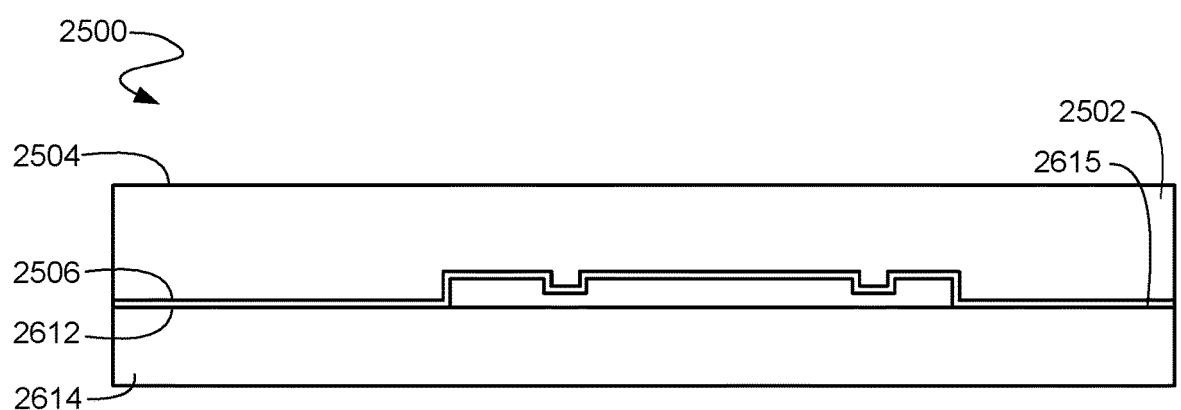
FIG. 26 shows the 3D stack configuration after fusion bonding according to one aspect of the present embodiments.

Referring now to FIG. 26, the 3D stack configuration 2500 after fusion bonding is shown according to one aspect of the present embodiments. The second side 2506 of the first handle wafer 2502 is fusion bonded to a first side 2612 of a first MEMS device wafer 2614. The fusion bond oxide 2510 (FIG. 14) forms a fusion bond 2616, connecting the first handle wafer 2502 to the first MEMS device wafer 2614.

Figure 27:
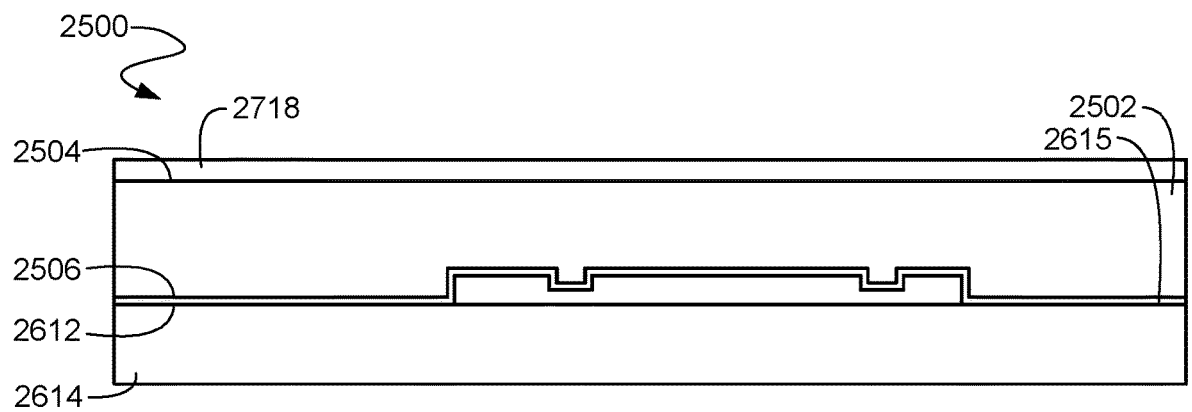
FIG. 27 shows the 3D stack configuration after oxide deposition according to one aspect of the present embodiments.

Referring now to FIG. 27, the 3D stack configuration 2500 after oxide deposition is shown according to one aspect of the present embodiments. Oxide is deposited on the first side 2504 of the first handle wafer 2502, covering the first side 2504. As such, the oxide forms a dielectric layer 2718 on the first side 2504 of the first handle wafer 2502.

Figure 28:
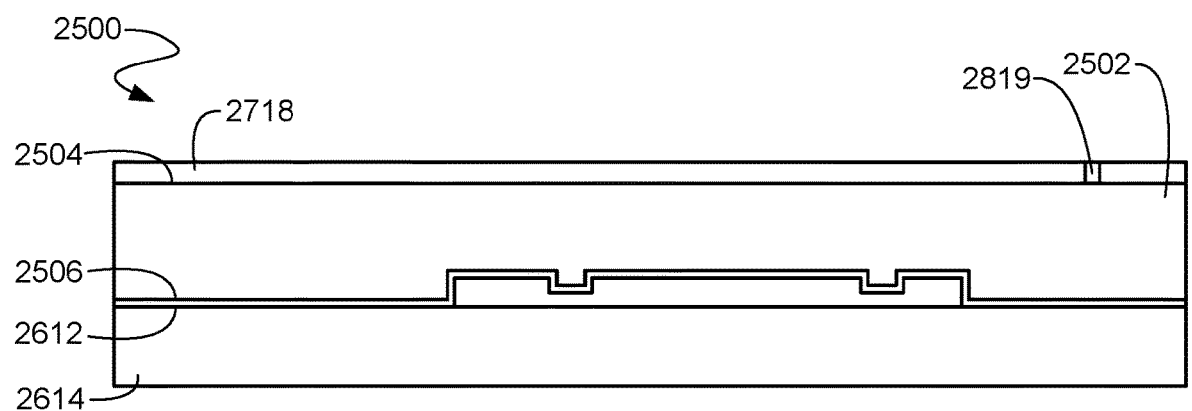
FIG. 28 shows the 3D stack configuration after tungsten via formation according to one aspect of the present embodiments.

Referring now to FIG. 28, the 3D stack configuration 2500 after tungsten via formation is shown according to one aspect of the present embodiments. One or more tungsten vias 2819 are formed in the dielectric layer 2718.

Figure 29:
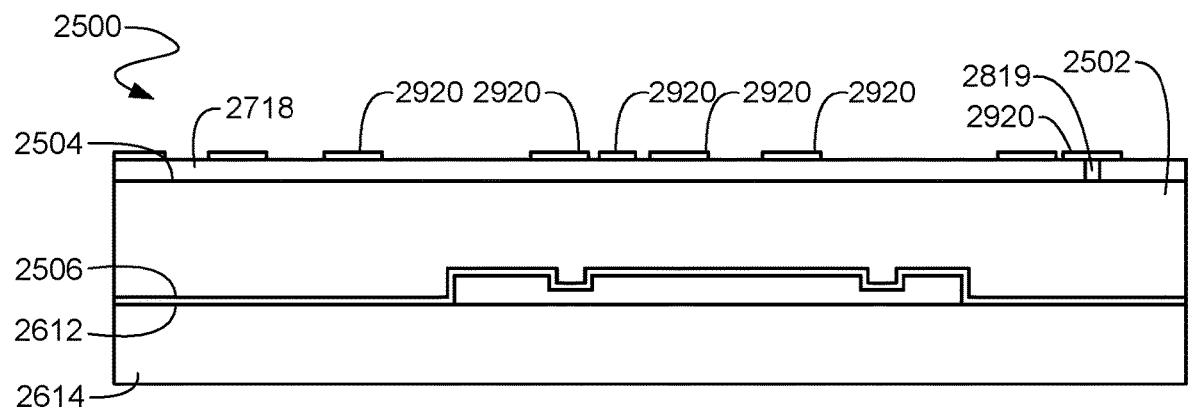
FIG. 29 shows the 3D stack configuration after electrode deposition and patterning according to one aspect of the present embodiments.

Referring now to FIG. 29, the 3D stack configuration 2500 after electrode deposition and patterning is shown according to one aspect of the present embodiments. Electrode deposition and patterning forms one or more electrodes 2920 (e.g. first electrode, second electrode, etc.) on the dielectric layer 2718. The electrodes 2920 may include, for example, bond, sense, and/or shield electrodes. It is understood that the preceding list of electrodes is non-limiting, and some embodiments may include other electrodes for any purpose. In various embodiments, the electrodes 2920 may include the same material or different materials (e.g. bond electrodes may include different materials than sense electrodes). Some non-limiting examples of materials used in the electrodes 2920 include Al, poly Si, Ti/TiN, etc.

Figure 30:
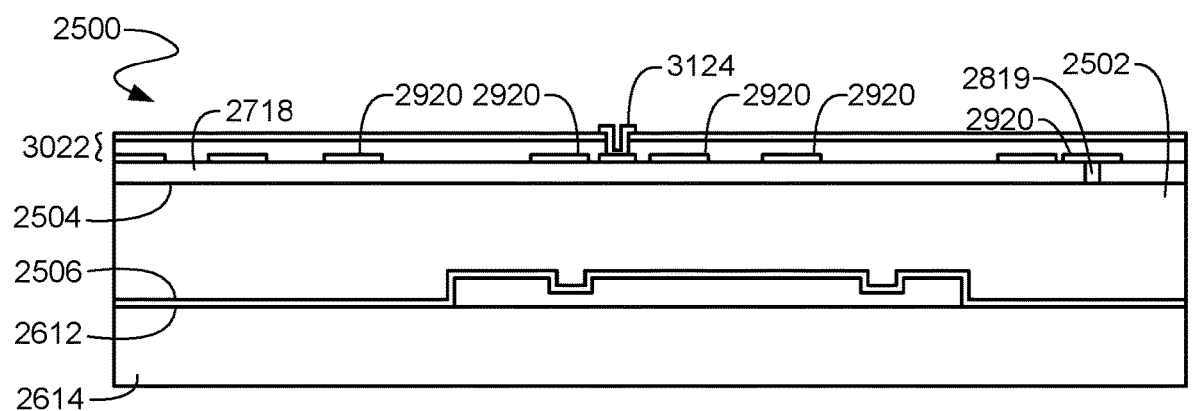
FIGS. 30 and 31 show the 3D stack configuration after passivation stack deposition and patterning according to one aspect of the present embodiments.
Figure 31:
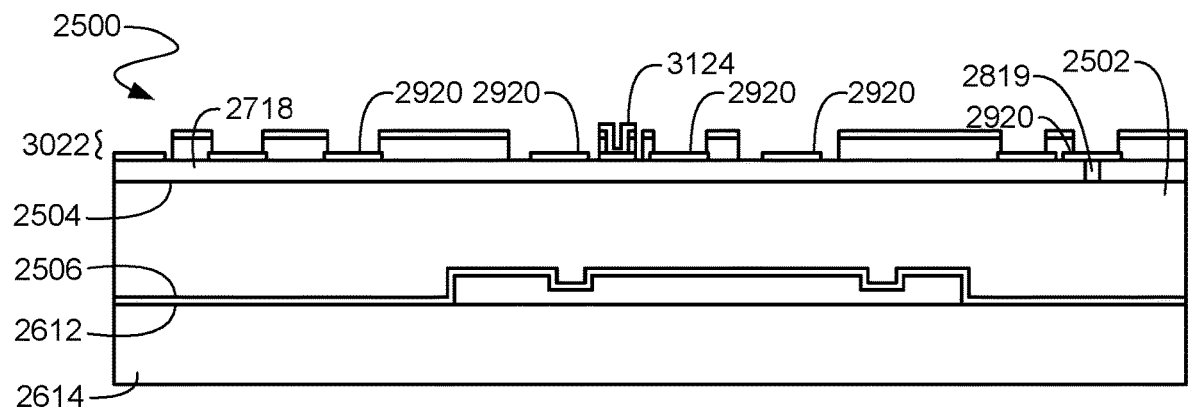

Referring now to FIGS. 30 and 31, the 3D stack configuration 2500 after passivation stack deposition and patterning is shown according to one aspect of the present embodiments. A passivation stack 3022 is deposited over the electrodes 2920 and the dielectric layer 2718. The passivation stack 3022 is patterned, exposing the electrodes 2920. In some embodiments, the patterning of the passivation stack 3022 may form various components (e.g. bumpstop 3124, etc.).

Figure 32:
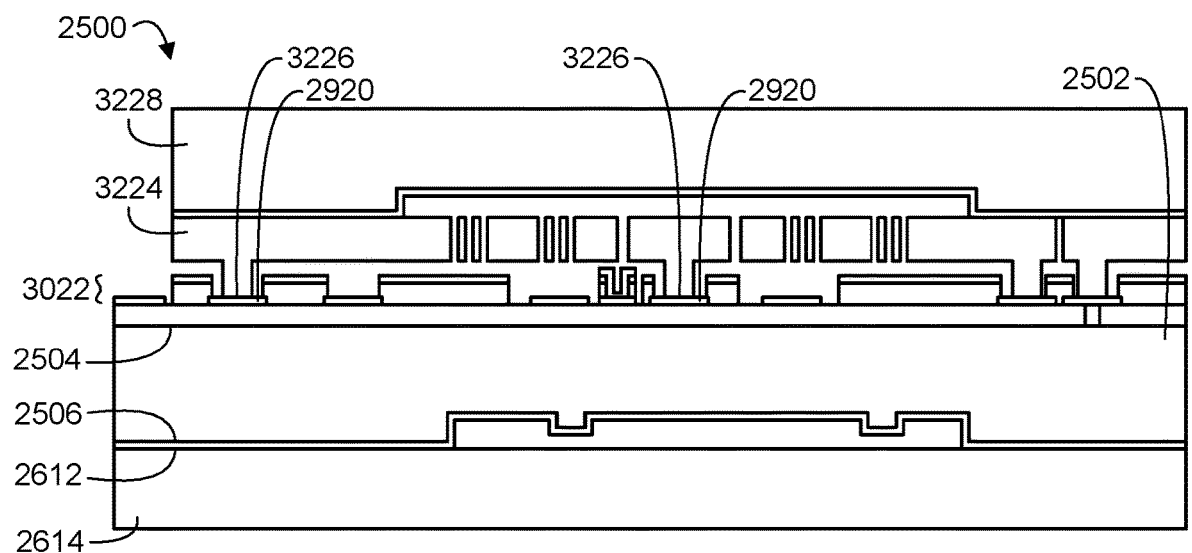
FIG. 32 shows the 3D stack configuration after eutectic bonding of another MEMS device wafer according to one aspect of the present embodiments.

Referring now to FIG. 32, the 3D stack configuration 2500 after eutectic bonding of another MEMS device wafer is shown according to one aspect of the present embodiments. A second MEMS device wafer 3224 is eutecticly bonded with one or more first eutectic bonds 3226 to one or more of the electrodes 2920 (e.g. bond electrodes). In some embodiments, the first eutectic bonds 3226 include Al and Si.

A second handle wafer 3228 is fusion bonded to the second MEMS device wafer 3224. In various embodiments, the second MEMS device wafer 3224 includes any MEMS device. For example, the second MEMS device wafer 3224 may include a gyroscope or an accelerometer.

Figure 33:
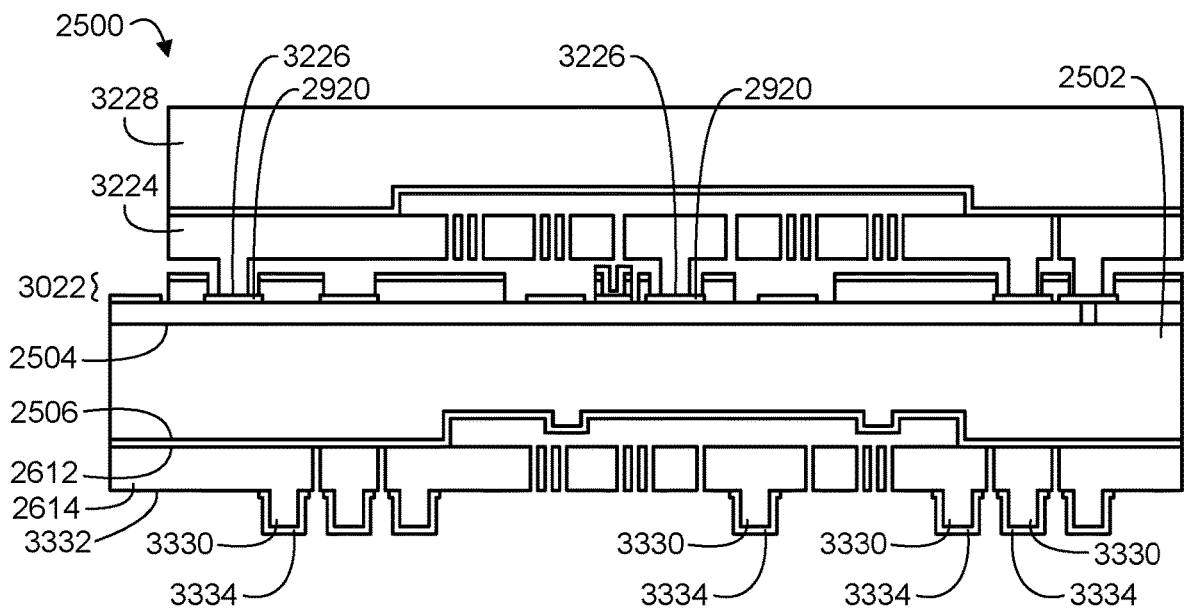
FIG. 33 shows the 3D stack configuration after standoff formation and actuator etch according to one aspect of the present embodiments.

Referring now to FIG. 33, the 3D stack configuration 2500 after standoff formation and actuator etch is shown according to one aspect of the present embodiments. Standoffs 3330 are formed on a second side 3332 of the first MEMS device wafer 2614. A eutectic bond metal 3334 (e.g. germanium) is deposited on the standoffs 3330. An actuator etch forms another MEMS device in the first MEMS device wafer 2614. The first MEMS device wafer 2614 includes any MEMS device. For example, the first MEMS device wafer 2614 may include a gyroscope or an accelerometer.

Figure 34:
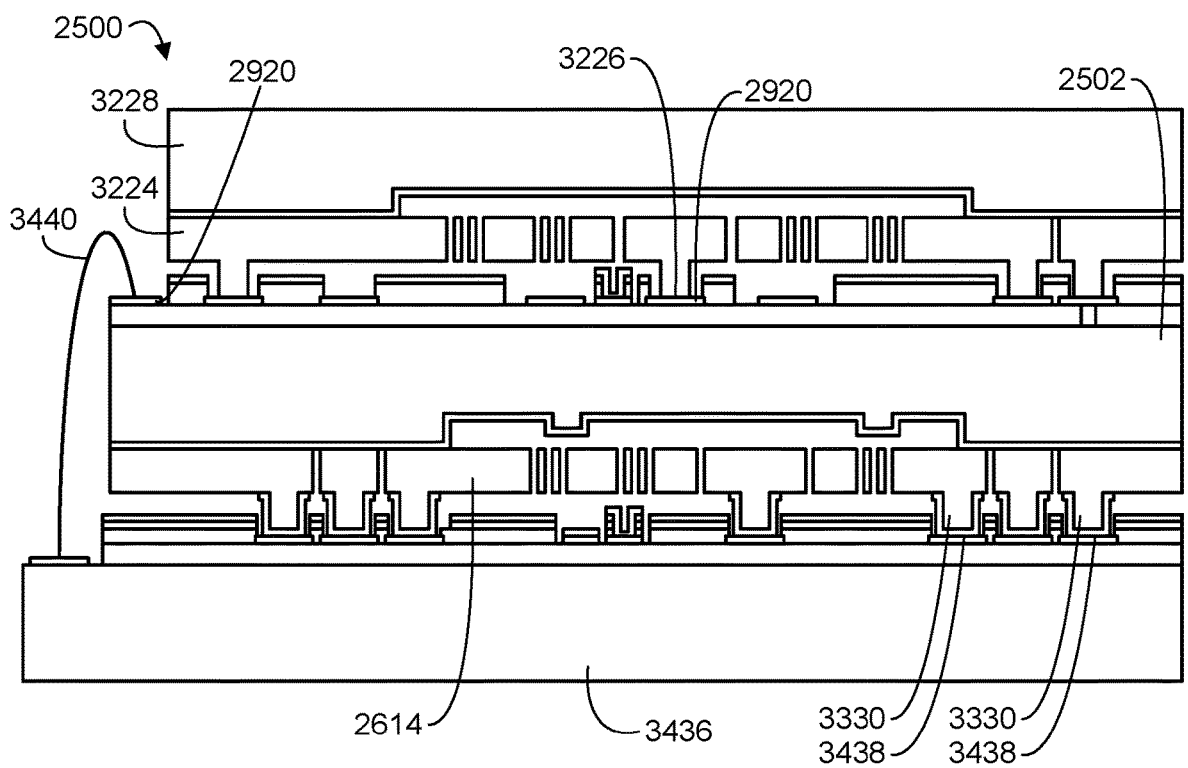
FIG. 34 shows the 3D stack configuration after eutectic bonding with a CMOS wafer according to one aspect of the present embodiments.

Referring now to FIG. 34, the 3D stack configuration 2500 after eutectic bonding with a CMOS wafer is shown according to one aspect of the present embodiments. A CMOS wafer 3436 is eutecticly bonded to the first MEMS device wafer 2614. One or more second eutectic bonds 3438 eutecticly bond one or more of the standoffs 3330 to the CMOS wafer 3436. In various embodiments, the second eutectic bonds 3438 include different materials than the first eutectic bonds 3226. For example, the second eutectic bond may include Al and Ge. As such, in some embodiments, the first eutectic bonds 3226 may have a higher melting point than the second eutectic bonds 3438. One or more bond wires 3440 electrically connect one or more of the electrodes 2920 corresponding to the second MEMS device wafer 3224 to the CMOS wafer 3436.

FIG. 35 shows an exemplary flow diagram 3500 for forming a 3D stack configuration according to one aspect of the present embodiments. At block 3502, a first side of a MEMS device wafer is fusion bonded to a second side of a first handle wafer. At a block 3504, a TSV is formed from a first side of the first handle wafer to the second side of the first handle wafer and into the first MEMS device wafer. At a block 3506, a dielectric layer is formed on the first side of the first handle wafer. At a block 3508, a tungsten via is formed in the dielectric layer. At a block 3510, electrodes are formed on the dielectric layer. At a block 3512, a second MEMS device wafer is eutecticly bonded with a first eutectic bond to the electrodes, wherein the TSV electrically connects the first MEMS device wafer to the second MEMS device wafer. At a block 3514, standoffs are formed on a second side of the first MEMS device wafer. At a block 3516, a CMOS wafer is eutecticly bonded with a second eutectic bond to the standoffs, wherein the second eutectic bond includes different materials than the first eutectic bond.

FIG. 36 shows another exemplary flow diagram 3600 for forming a 3D stack configuration according to one aspect of the present embodiments. At block 3602, a first side of a MEMS device wafer is fusion bonded to a second side of a first handle wafer. At a block 3604, a dielectric layer is formed on a first side of the first handle wafer. At a block 3606, a tungsten via is formed in the dielectric layer. At a block 3608, electrodes are formed on the dielectric layer, wherein the electrodes include a first electrode and a second electrode. At a block 3610, a second MEMS device wafer is eutecticly bonded with a first eutectic bond to the first electrode. At a block 3612, standoffs are formed on a second side of the first MEMS device wafer. At a block 3614, a CMOS wafer is eutecticly bonded with a second eutectic bond to the standoffs, wherein the second eutectic bond includes different materials than the first eutectic bond. At a block 3616, the second electrode is eutecticly connected to the CMOS wafer with a bond wire.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   fusion bonding a first side of a first micro-electro-mechanical system ("MEMS") device wafer to a second side of a first handle wafer;
   forming a through silicon via ("TSV") from a first side of the first handle wafer to the second side of the first handle wafer and into the first MEMS device wafer;
   forming a dielectric layer on the first side of the first handle wafer;
   forming a tungsten via in the dielectric layer;
   forming electrodes on the dielectric layer;
   eutecticly bonding a second MEMS device wafer with a first eutectic bond to the electrodes, wherein the TSV electrically connects the first MEMS device wafer to the second MEMS device wafer;
   forming standoffs on a second side of the first MEMS device wafer; and
   eutecticly bonding a complementary metal-oxide semiconductor ("CMOS") wafer with a second eutectic bond to the standoffs, wherein the second eutectic bond includes different materials than the first eutectic bond.

2. The method of claim 1, further comprising forming a trench oxide fill in the first handle wafer, wherein
   the trench oxide fill electrically isolates the TSV in the first handle wafer,
   the first handle wafer includes highly doped silicon, and
   highly doped silicon includes a dopant density greater than or equal to ("≥") $10^{17}$ atoms per $cm^3$.

3. The method of claim 2, further comprising doping silicon with poly anneal or poly drive-in to form the highly doped silicon.

4. The method of claim 1, further comprising filling the TSV with polysilicon.

5. The method of claim 1, further comprising in-situ doping of polysilicon in the TSV.

6. The method of claim 1, further comprising forming a sense electrode and a shield electrode on the dielectric layer.

7. The method of claim 1, further comprising depositing germanium on the standoffs.

8. The method of claim 1, wherein the first eutectic bond includes Al and Si.

9. The method of claim 1, wherein the second eutectic bond includes Al and Ge.

10. The method of claim 1, wherein the first MEMS device wafer includes a gyroscope or accelerometer and the second MEMS device wafer includes another gyroscope or accelerometer.

11. A method comprising:
fusion bonding a first side of a first micro-electro-mechanical system ("MEMS") device wafer to a second side of a first handle wafer;
forming a dielectric layer on a first side of the first handle wafer;
forming a tungsten via in the dielectric layer;
forming electrodes on the dielectric layer, wherein the electrodes include a first electrode and a second electrode;
eutecticly bonding a second MEMS device wafer with a first eutectic bond to the first electrode;
forming standoffs on a second side of the first MEMS device wafer;
eutecticly bonding a complementary metal-oxide semiconductor ("CMOS") wafer with a second eutectic bond to the standoffs, wherein the second eutectic bond includes different materials than the first eutectic bond; and
electrically connecting the second electrode to the CMOS wafer with a bond wire.

12. The method of claim 11, further comprising forming a sense electrode and a shield electrode on the dielectric layer.

13. The method of claim 11, further comprising depositing germanium on the standoffs.

14. The method of claim 11, wherein the first eutectic bond includes Al and Si.

15. The method of claim 11, wherein the second eutectic bond includes Al and Ge.

16. The method of claim 11, wherein the first MEMS device wafer includes a gyroscope or accelerometer and the second MEMS device wafer includes another gyroscope or accelerometer.

17. An apparatus comprising:
a first micro-electro-mechanical system ("MEMS") device wafer;
a first handle wafer, wherein a first side of the first MEMS device wafer is fusion bonded to a second side of the first handle wafer;
a dielectric layer on a first side of the first handle wafer;
a tungsten via in the dielectric layer;
electrodes on the dielectric layer, wherein the electrodes include a first electrode and a second electrode;
a second MEMS device wafer eutecticly bonded to the first electrode with a first eutectic bond;
standoffs on a second side of the first MEMS device wafer; and
a complementary metal-oxide semiconductor ("CMOS") wafer eutecticly bonded to the standoffs with a second eutectic bond, wherein the second eutectic bond includes different materials than the first eutectic bond.

18. The apparatus of claim 17, further comprising a through silicon via ("TSV") from the first side of the first handle wafer to the second side of the first handle wafer and into the first MEMS device wafer, wherein the TSV electrically connects the first MEMS device wafer to the second MEMS device wafer.

19. The apparatus of claim 18, further comprising a trench oxide fill in the first handle wafer, wherein the trench oxide fill electrically isolates the TSV in the first handle wafer.

20. The apparatus of claim 17, further comprising a bond wire electrically connecting the second electrode to the CMOS wafer.

21. The apparatus of claim 19, wherein the first handle wafer is highly doped, and the highly doped first handle wafer includes a dopant density greater than or equal to ("$\geq$") $10^{17}$ atoms per $cm^3$.

22. The apparatus of claim 17, further comprising a through silicon via ("TSV") from a first side of the first handle wafer to the second side of the first handle wafer and into the first MEMS device wafer, wherein the TSV is filled with polysilicon.

23. The apparatus of claim 17, wherein the first eutectic bond includes Al and Si.

24. The apparatus of claim 17, wherein the second eutectic bond includes Al and Ge.

25. The apparatus of claim 17, wherein the first MEMS device wafer includes a gyroscope or accelerometer and the second MEMS device wafer includes another gyroscope or accelerometer.

* * * * *